United States Patent
Hsieh

(10) Patent No.: US 7,404,119 B2
(45) Date of Patent: Jul. 22, 2008

(54) CIRCUIT FOR TESTING POWER DOWN RESET FUNCTION OF AN ELECTRONIC DEVICE

(75) Inventor: Ming-Chih Hsieh, Tu-Chen (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 235 days.

(21) Appl. No.: 11/025,196

(22) Filed: Dec. 29, 2004

(65) Prior Publication Data

US 2006/0041811 A1  Feb. 23, 2006

(30) Foreign Application Priority Data

Aug. 19, 2004   (CN)   ................ 2004 1 0051212

(51) Int. Cl.
  *G01R 31/3181*  (2006.01)
  *G01R 31/305*  (2006.01)
(52) U.S. Cl. ................................. 714/724; 324/500
(58) Field of Classification Search ............... 714/724, 714/742, 25, 48
  See application file for complete search history.

(56) References Cited

U.S. PATENT DOCUMENTS

| | | | | |
|---|---|---|---|---|
| 4,471,418 A | * | 9/1984 | Tuma | ..................... 363/21.07 |
| 5,047,987 A | * | 9/1991 | Kosuge | ..................... 365/228 |
| 5,105,373 A | * | 4/1992 | Rumsey et al. | ................. 703/14 |
| 5,450,417 A | | 9/1995 | Truong et al. | .............. 371/22.1 |
| 6,943,596 B2 | * | 9/2005 | Slamowitz et al. | ......... 327/143 |
| 2001/0020670 A1 | * | 9/2001 | Hyoga et al. | ................ 250/205 |
| 2003/0236928 A1 | * | 12/2003 | Wang et al. | .................... 710/8 |

* cited by examiner

*Primary Examiner*—Cynthia Britt
*Assistant Examiner*—Dipakkumar Gandhi
(74) *Attorney, Agent, or Firm*—Morris Manning Martin LLP; Tim Tingkang Xia, Esq.

(57) ABSTRACT

A circuit for testing a power down reset function of an electronic device includes a reference power source (Vref), a first variable resistor (R1) with one end connected to the reference power source, a second variable resistor (R2), and a jumper (10). One end of the second variable resistor is connected to the other end of the first variable resistor, and the other end of the second variable resistor is grounded. The jumper includes four pins, with a first pin (101) connected to a node (B) between the first variable resistor and the second variable resistor, a third pin (103) grounded, and a second pin (102) and a fourth pin (104) commonly connected to a voltage testing pin (20) of an electronic device (2). The circuit is simple, is conveniently operated, and saves costs.

2 Claims, 1 Drawing Sheet

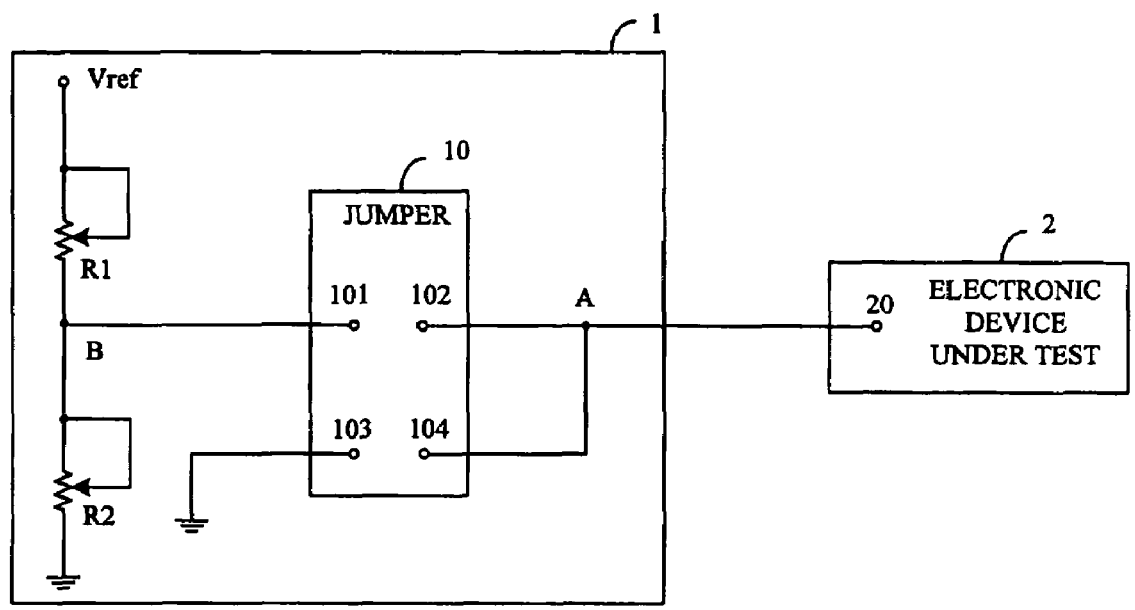

CIRCUIT FOR TESTING POWER DOWN RESET FUNCTION OF AN ELECTRONIC DEVICE

BACKGROUND OF THE INVENTION

1. Field of the Invention

The present invention relates to circuits for testing power down reset functions of electronic devices.

2. Description of the Prior Art

Most electronic devices need steady power sources to work normally. If the power source breaks off, or if the voltage of the power source is lower than a rated value of the electronic device, the electronic device cannot work normally. When the power source recovers, a user needs to press a reset button on the electronic device to reset the electronic device. However, this method is unduly inconvenient. Nowadays, most electronic devices comprise circuits or chips that have power down reset functions. If the power source breaks off, or if a voltage of the power source is lower than a rated value, the electronic device cannot work normally. Then when the power source returns to normal, the circuit or chip can reset the electronic device automatically. In general, there is a circuit for testing voltage ("testing circuit") located between the power source and the circuit or chip that has the power down reset function. If a voltage of the power source is lower than a minimum voltage needed to ensure that the electronic device works normally, the testing circuit sends a low voltage signal to a voltage testing pin of the electronic device, and the electronic device cannot work normally. When the power source returns to normal, the testing circuit sends a reset signal to the voltage testing pin of the electronic device in order to reset the electronic device.

The power down reset function of the electronic device must be fully operational in order to keep the electronic device working normally. Therefore, there is the need for a testing circuit to test the power down reset function of the electronic device. Common testing circuits are integrated in the electronic devices themselves. U.S. Pat. No. 5,450,417, issued on Sep. 12, 1995 and entitled "Circuit for testing power-on-reset circuitry," provides a testing circuit for determining whether the reset function of the power-on-reset circuitry is valid. The testing circuit and the power-on-reset circuitry are parts of a control circuit that is an integrated circuit. If the reset function of the power-on-reset circuitry is found to be defective, and must be discarded, because the power-on-reset circuitry is part of the control circuit, and the control circuit is an integrated circuit, the control circuit must be discarded too. Then because the testing circuit is part of the control circuit, this necessarily means that the perfectly good testing circuit must be discarded too, which is wasteful. In addition, the testing circuit makes the control circuit more complicated.

Therefore, there is a need for an inexpensive, independent and simple testing circuit that can test whether the power down reset function of an electronic device is valid.

SUMMARY OF THE INVENTION

An objective of the present invention is to provide an independent and simple circuit for testing a power down reset function of an electronic device.

In order to fulfill the above-mentioned objective, the present invention provides a circuit for testing a power down reset function of an electronic device. The circuit comprises: a reference power source; a first variable resistor with one end connected to the reference power source; a second variable resistor, with one end connected to the other end of the first variable resistor, and the other end being grounded; and a jumper comprising four pins, a first pin being connected to a node between the first variable resistor and the second variable resistor, a third pin being grounded, and a second pin and a fourth pin being commonly connected to a voltage testing pin of the electronic device.

The circuit of the present invention employs two variable resistors and the jumper comprising four pins to test the power down reset function of the electronic device. The circuit is simple and is conveniently operated. In addition, the circuit can save costs.

Other objects, advantages and novel features of the present invention will become more apparent from the following detailed description when taken in conjunction with the accompanying drawing, in which:

BRIEF DESCRIPTION OF THE DRAWING

The drawing is a schematic diagram of a circuit for testing a power down reset function of an electronic device according to a preferred embodiment of the present invention.

DETAILED DESCRIPTION OF THE INVENTION

The drawing is a schematic diagram of a circuit 1 for testing a power down reset function of an electronic device 2 that is under test. The circuit 1 is disposed on a testing board (not shown), and is connected to a voltage testing pin 20 of the electronic device 2 through an output end A. In the preferred embodiment, the circuit 1 comprises a reference power source Vref, a first variable resistor R1, a second variable resistor R2, a jumper 10 as a power-source switch, and the output end A for outputting voltage signals to the voltage testing pin 20 of the electronic device 2. The reference power source Vref is connected to one end of the first variable resistor R1. The other end of the first variable resistor R1 is connected to one end of the second variable resistor R2, and the other end of the second variable resistor R2 is grounded. The jumper 10 comprises a first pin 101, a second pin 102, a third pin 103, and a fourth pin 104. The first pin 101 is connected to a node B between the first variable resistor R1 and the second variable resistor R2. The third pin 103 is grounded. The second pin 102 and the fourth pin 104 are each connected to the output end A.

In the preferred embodiment, the voltage of the reference power source Vref is higher than a minimum rated voltage of the electronic device 2. Because a voltage $V_B$ on the node B is equal to Vref*R2/(R1+R2), the voltage $V_B$ can be configured to the minimum rated voltage of the electronic device 2 by regulating resistances of the first variable resistor R1 and the second variable resistor R2. In the preferred embodiment, the minimum rated voltage of the electronic device 2 is +3.3V, and the voltage of the power source Vref is +5V. If R2/(R1+R2) is equal to 0.66, the voltage $V_B$ on the node B is +3.3V, which is equal to the minimum rated voltage of the electronic device 2.

Before the circuit 1 tests the power down reset function of the electronic device 2, a user regulates the resistances of the first variable resistor R1 and the second variable resistor R2 to ensure that the voltage $V_B$ on the node B is equal to +3.3V, and then couples the output end A of the circuit 1 to the voltage testing pin 20 of the electronic device 2. Subsequently, the user couples the first pin 101 of the jumper 10 to the second pin 102 of the jumper 10. In such case, the voltage $V_A$ on the output end A is equal to the voltage $V_B$; that is, +3.3V. In this case, the electronic device 2 is powered normally, and the electronic device 2 starts to work normally. Then the user couples the third pin 103 of the jumper 10 to the fourth pin 104 of the jumper 10. Under this situation, the voltage $V_A$ is 0. Thus, the electronic device 2 is powered with a voltage lower than the minimum rated voltage of the electronic device 2, and cannot work normally. Finally, the user disconnects the third pin 103 from the fourth pin 104. The voltage $V_A$ is equal to +3.3V, and the electronic device 2 is powered normally. In this case, if the electronic device 2 resets, it indicates that the power down reset function of the electronic device 2 is functional. If the electronic device 2 does not reset, it indicates that the power down reset function is out of order. Thereby, the circuit 1 can determine whether the power down reset function of the electronic device 2 is functional.

While a preferred embodiment of the present invention has been described above, it should be understood that it has been presented by way of example only and not by way of limitation. Thus the breadth and scope of the present invention should not be limited by the above-described exemplary embodiment, but should be defined only in accordance with the following claims and their equivalents.

What is claimed is:

1. A method for testing a power down reset function of an electronic device, comprising:
    providing a first voltage equal to a minimum rated voltage of the electronic device to said electronic device;
    providing a second voltage lower than the minimum rated voltage of the electronic device to said electronic device;
    switching connection of said first and second voltages with said electronic device; and
    recording performances of said power down reset function during said switching step.

2. The method as recited in claim 1, wherein a jumper is used to switch said connection in said switching step.

* * * * *